(12) United States Patent
Ueno et al.

(10) Patent No.: US 12,203,746 B2
(45) Date of Patent: Jan. 21, 2025

(54) ROTARY ENCODER

(71) Applicant: HARMONIC DRIVE SYSTEMS INC., Tokyo (JP)

(72) Inventors: Shintaro Ueno, Azumino (JP); Yuki Kato, Azumino (JP); Yoshinori Shibahara, Azumino (JP)

(73) Assignee: HARMONIC DRIVE SYSTEMS INC., Tokyo (JP)

( * ) Notice: Subject to any disclaimer, the term of this patent is extended or adjusted under 35 U.S.C. 154(b) by 238 days.

(21) Appl. No.: 17/758,245

(22) PCT Filed: Apr. 24, 2020

(86) PCT No.: PCT/JP2020/017862
§ 371 (c)(1),
(2) Date: Jun. 30, 2022

(87) PCT Pub. No.: WO2021/215013
PCT Pub. Date: Oct. 28, 2021

(65) Prior Publication Data
US 2023/0048463 A1 Feb. 16, 2023

(51) Int. Cl.
*H05K 1/14* (2006.01)
*G01B 7/30* (2006.01)
(Continued)

(52) U.S. Cl.
CPC ............ *G01B 11/26* (2013.01); *G01B 7/30* (2013.01); *G01D 5/145* (2013.01); *G01P 3/36* (2013.01); *G01P 3/481* (2013.01); *H02K 11/215* (2016.01)

(58) Field of Classification Search
CPC ............ G01B 11/26; G01B 7/30; H05K 1/14
See application file for complete search history.

(56) References Cited

U.S. PATENT DOCUMENTS 5,038,031 A * 8/1991 Kurosawa .......... G01D 5/34723
250/227.28
2004/0008002 A1 1/2004 Kamio et al.
(Continued)

FOREIGN PATENT DOCUMENTS

JP 2004048837 A 2/2004
JP 2012220192 A 11/2012
(Continued)

OTHER PUBLICATIONS

International Search Report (PCT/ISA/210) with English translation and Written Opinion (PCT/ISA/237) mailed on Jul. 7, 2020, by the Japanese Patent Office as the International Searching Authority for International Application No. PCT/JP2020/017862.

*Primary Examiner* — Uzma Alam
*Assistant Examiner* — Adrian Ignacio Silva
(74) *Attorney, Agent, or Firm* — Buchanan Ingersoll & Rooney PC

(57) ABSTRACT

A rotary encoder is incorporated in an annular space formed between a hollow rotating shaft and an encoder case. The rotary encoder has an annular printed wiring substrate, a plurality of mounting substrates that are outward from the printed wiring substrate in the radial direction and are arranged in the circumferential direction, and inter-substrate wiring cables bridged between the printed wiring substrate and each of the mounting substrates in the radial direction. Power supply to the mounting substrates and signal transmission and reception between the mounting substrates can be accomplished without routing around the wiring cables. It is possible to achieve a rotary encoder that is suitable for being incorporated in a narrow annular space.

16 Claims, 3 Drawing Sheets

(51) Int. Cl.
   *G01B 11/26* (2006.01)
   *G01D 5/14* (2006.01)
   *G01P 3/36* (2006.01)
   *G01P 3/481* (2006.01)
   *H02K 11/215* (2016.01)

(56) References Cited

U.S. PATENT DOCUMENTS

2014/0021945 A1   1/2014  Omoto
2014/0203800 A1*  7/2014  Sasaki .................. G01D 5/2046
                                              324/207.16
2019/0301898 A1* 10/2019  Ueno ..................... G01D 5/245

FOREIGN PATENT DOCUMENTS

| | | | |
|---|---|---|---|
| JP | 2015230192 A | 12/2015 | |
| JP | 2019138720 A | 8/2019 | |
| WO | 2011061794 A1 | 5/2011 | |
| WO | WO-2017212654 A1 * | 12/2017 | ............. G01D 5/147 |

* cited by examiner

ROTARY ENCODER

TECHNICAL FIELD

The present invention relates to a rotary encoder that detects, inter alia, the rotational speed of a motor.

BACKGROUND ART

Magnetic encoders, optical encoders, and other rotary encoders are used in order to detect the rotation states (speed, rotational angle, rotation position, etc.) of motors, etc. In the case of detecting the rotation state of, inter alia, a hollow shaft of a hollow motor, an annular space formed between the hollow shaft and a case surrounding the hollow shaft is used as a space for installation of substrates, wiring cables, and other constituent components of the rotary encoder.

FIG. 3 is an illustrative diagram showing the disposition state of, inter alia, encoder substrates of a rotary encoder in the case described above. As shown in FIG. 3, encoder substrates 111-114 divided into a plurality of units are disposed in an annular space 103 formed between a hollow rotating shaft 101 and a cylindrical case 102 in a state in which the encoder substrates 111-114 surround the outer periphery of the hollow rotating shaft 101. The encoder substrates 111-114 include a detection element mounting substrate on which is mounted a magnetic detection element or other detection element, a signal processing substrate on which is mounted a signal-processing module that generates encoded signals having a different phase than the detection signals from the detection element, an interface substrate on which is mounted an interface circuit that transmits and receives signals to and from an external unit, etc. Power-supply wiring cables, signal-transmitting-and-receiving wiring cables, etc., from the exterior are connected to these encoder substrates 111-114. For example, adjacent encoder substrates 111, 112 are interconnected by a wiring cable 121. Encoder substrates 111, 114 that are set apart in the circumferential direction are connected by a wiring cable 122. A power-supply wiring cable 123 is drawn in from outside of the case 102, and an output wiring cable 124 for outputting encoder output signals is drawn out to the exterior of the case.

Patent document 1 proposes a magnetic absolute encoder that is used attached to a motor. In the magnetic absolute encoder disclosed in Patent document 1, one flexible printed wiring substrate (encoder substrate) on which are mounted a plurality of magnetic detection elements is disposed in a loop so as to surround a two-pole magnet and a multi-pole magnet. This makes it possible to omit an operation for assembling a plurality of encoder substrates on which magnetic detection elements are mounted, and makes it possible to easily carry out an operation for positioning the magnetic detection elements and an operation for hard-wiring wirings drawn out from encoder substrates. Patent document 2 proposes a rotation detection device that is suited to being incorporated in a narrow annular gap within a hollow actuator, etc. In this rotation detection device, there is employed a configuration in which a plurality of rigid substrates are joined in a circumferential direction.

PRIOR-ART LITERATURE

Patent Literature

Patent document 1: WO2011/061794
Patent document 2: WO2017/212654

SUMMARY OF THE INVENTION

Problem to be Solved by the Invention

The following problems are presented in a rotary encoder provided with the prior-art encoder substrates and wiring shown in FIG. 3. Firstly, when the annular space serving as the installation space is narrow, inter-substrate wiring cables are diverted from and routed around the edges of the encoder substrates. It is necessary to ensure a space for routing the cables in the narrow annular space. Additionally, effort is required in an operation for connecting the inter-substrate wiring cables. Moreover, there are also concerns regarding deterioration in the quality of signals transferred via the wiring cables that are diverted from and routed around the substrates.

Secondly, when the encoder substrates are wired and interconnected within an annular space having a narrow radial-direction width, it is difficult to ensure a space for drawing out the wiring cables from the radially outer or inner side, and the wiring cables are drawn out in the circumferential direction. In this case, cable connectors are mounted on the substrates in a state of facing in the circumferential direction. It is necessary to set adjacent substrates apart from each other in order to ensure the space for disposing the cable connectors and the wiring cables between the adjacent substrates. Additionally, when the gaps between adjacent substrates are narrow, it is necessary to use special jigs in a wiring operation. Therefore, the usage efficiency of the narrow annular space is poor.

Thirdly, when standard encoder substrates are assembled in motors of different sizes, it is necessary to change the length of inter-substrate wiring cables for each size of motor. It is impossible to standardize or harmonize the cables, and the cost advantages of substrate standardization decrease.

By contrast, in the magnetic absolute encoder disclosed in Patent document 1, there is used a single flexible printed wiring substrate (encoder substrate) that is specially designed for each size of motor being assembled. It is unnecessary to route wiring cables, and it is also easy to carry out operations for routing and hard-wiring inter-substrate wiring cables. However, in the case of use in motors of different sizes, a disadvantage is presented in that it is impossible to standardize the encoder substrate.

In the rotation detection device disclosed in Patent document 2, there is used an encoder substrate configured by annularly joining a plurality of rigid substrates, the rotation detection device being suited to being incorporated in a narrow annular space. However, no consideration has been given to factors such as routing of wiring that is drawn out from the rigid substrates, and wiring and joining between rigid substrates that are located apart from each other.

In view of the foregoing, it is an object of the present invention to provide a rotary encoder that is suited to being incorporated in a narrow annular space, the rotary encoder facilitating operations for routing and hard-wiring inter-substrate wiring cables, and enabling standardized use even in motors of different sizes.

Means of Solving the Problem

In order to resolve the problems described above, the rotary encoder according to the present invention has an encoder circuit substrate provided with a plurality of mounting substrates, an annular printed wiring substrate, and inter-substrate wiring cables that interconnect the printed wiring substrate and each of the mounting substrates. The mounting substrates that are adjacent to the printed wiring substrate on the radially outer or inner side thereof, or that are adjacent thereto in the direction of a central axis, are positioned along the printed wiring substrate in the circumferential direction thereof. The inter-substrate wiring cables are bridged in the radial direction, or in the direction of the central axis, between the printed wiring substrate and each of the mounting substrates. The printed wiring substrate is provided with a wiring pattern for supplying power to each of the mounting substrates, and a wiring pattern for transferring signals between at least two of the mounting substrates.

In the rotary encoder according to the present invention, the mounting substrates are interconnected via the annular printed wiring substrate. The wiring pattern for supplying power to the mounting substrates is printed on the printed wiring substrate. Externally supplied electric power is distributed to the mounting substrates via the power-supply wiring pattern of the printed wiring substrate. It is unnecessary for power-supply wiring cables in a number corresponding to the plurality of mounting substrates to be diverted from and routed around the edges of the mounting substrates arranged in the circumferential direction. Additionally, the signal-transfer wiring pattern for interconnecting the mounting substrates is printed on the printed wiring substrate. It is unnecessary to route wiring cables for interconnecting the mounting substrates located apart from each other in the circumferential direction. Thus, the need for a space for installation of power-supply wiring cables and signal-transfer wiring cables, and the need for an operation for installing these cables, are both obviated.

Additionally, the mounting substrates and the printed wiring substrate are interconnected by the inter-substrate wiring cables bridged in the radial direction, or in the direction of the central axis, between the mounting substrates and the printed wiring substrate. It is unnecessary to widen the gap between adjacent mounting substrates in the circumferential direction to ensure a wiring space. Additionally, because it is unnecessary for long wiring cables to be routed in the circumferential direction, it is possible to minimize any deterioration in the quality of signals being transferred.

Furthermore, it is easy to standardize the mounting substrates, the printed wiring substrate, and the inter-substrate wiring cables among rotary encoders used in motors of different sizes.

It is desirable for the mounting substrates to be disposed on the radially outer side of the annular printed wiring substrate. Disposing the printed wiring substrate on the inner side relative to the mounting substrates makes it possible to reduce the outside-diameter dimensions of the printed wiring substrate and to reduce the circumference thereof. This makes it possible to reduce the length of a wiring pattern extending in the circumferential direction on the printed wiring substrate in order to interlink the mounting substrates.

The rotary encoder according to the present invention is suited to being incorporated in an annular space. The annular space is formed between a hollow rotating shaft and an encoder case that surrounds the hollow rotating shaft.

When the rotary encoder according to the present invention is incorporated into a motor, or into an actuator provided with a motor and a reducer, the rotary encoder can be directly incorporated into an annular space between a motor shaft and a motor case, or into an annular space between a reducer output shaft and a reducer case.

MODE FOR CARRYING OUT THE INVENTION

Figure 1:
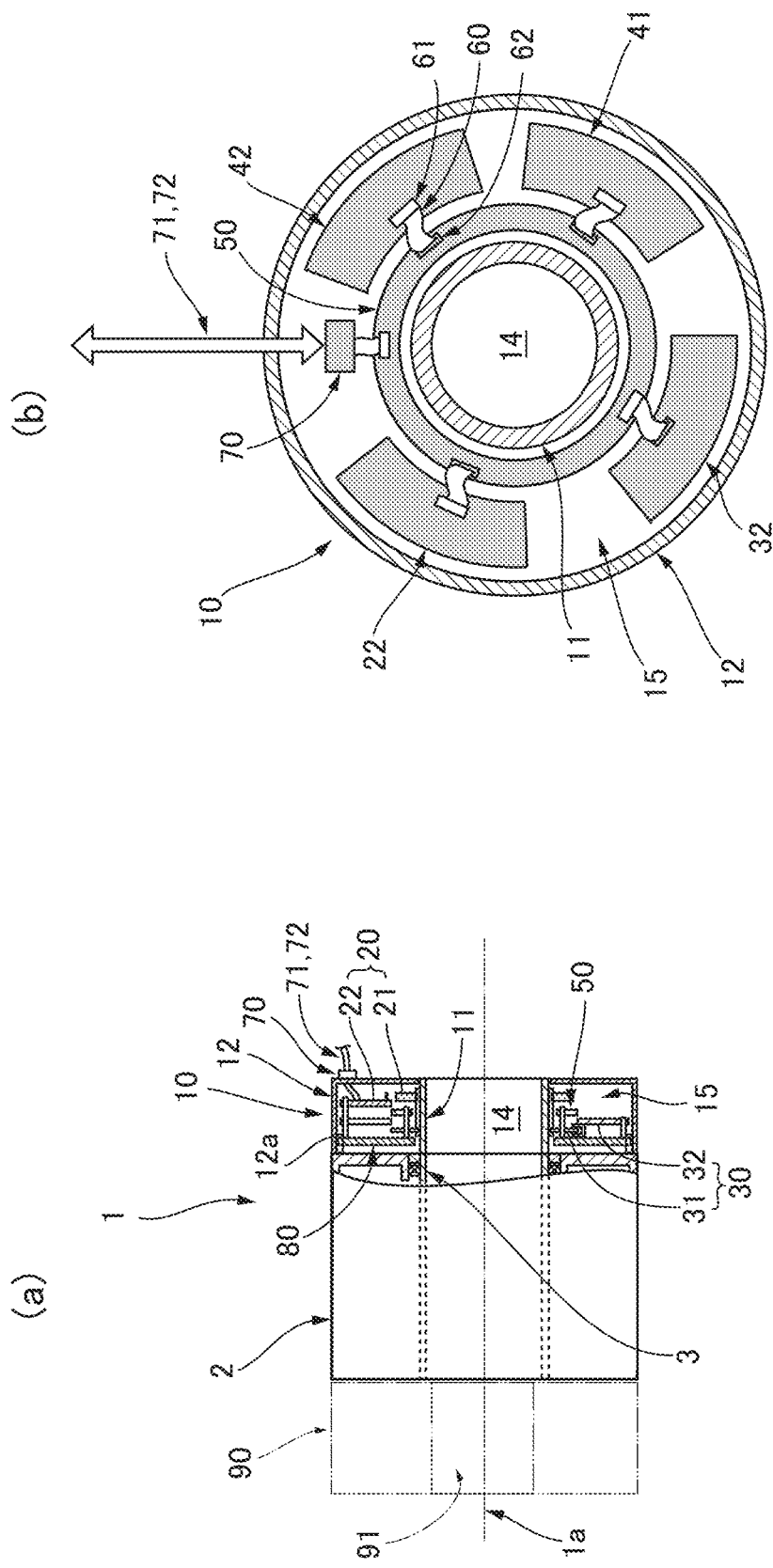
FIG. 1(a) is a schematic diagram showing a hollow motor provided with a rotary encoder to which the present invention is applied.
FIG. 1(b) is an illustrative diagram showing the arrangement state of mounting substrates, etc., of the rotary encoder.

A hollow motor provided with a rotary encoder according to embodiments of the present invention is described below with reference to the accompanying drawings.

FIG. 1(a) is a schematic diagram showing the hollow motor, and FIG. 1(b) is an illustrative diagram showing the arrangement state of an encoder substrate, etc., of the rotary encoder. The hollow motor 1 is provided with a cylindrical motor case 2. A hollow motor shaft 3 that extends through the center of the motor case 2 is disposed inside the motor case 2. The hollow motor shaft 3 is rotatably supported, at portions located to the front and rear along the direction of a central axis 1a, by the motor case 2 via bearings. A motor rotor (not shown) is attached to the hollow motor shaft 3, and a motor stator (not shown) is attached to the side of the motor case 2 in a state of coaxially surrounding the motor rotor.

A rotary encoder 10 is attached to the rear end of the motor case 2. The rotary encoder 10 is provided with a hollow rotating shaft 11 that is formed integrally with an axial end section of the hollow motor shaft 3, and a cup-shaped encoder case 12 that surrounds the hollow rotating shaft 11. A circular hollow section 14 that extends through a central portion of the motor in the direction of the central axis 1a is formed by the hollow motor shaft 3 and the hollow rotating shaft 11. Additionally, in the rotary encoder 10, an annular space 15 is formed between the hollow rotating shaft 11 and a cylindrical portion 12a of the encoder case 12. The constituent components of the rotary encoder 10 are incorporated into the annular space 15.

An actuator provided with the rotary encoder according to the present invention is configured such that, for example, a reducer 90 is assembled at the front portion of the hollow motor 1, as indicated by virtual lines in FIG. 1(a). For example, a strain wave gearing is used as the reducer 90. In the case of a hollow actuator, a hollow reducer provided with a hollow section 91 extending through the center thereof is used as the reducer 90. An actuator hollow section extending through the center of the actuator is formed by the hollow section 91 and the circular hollow section 14 of the hollow motor 1.

In the hollow motor 1, the rotary encoder 10 is, e.g., an absolute encoder provided with a magnetic encoder section 20 and an optical encoder section 30. The magnetic encoder section 20 is provided with a two-pole magnetized magnet ring 21 that is coaxially secured to the hollow rotating shaft 11, and a mounting substrate 22 (MT substrate) that is attached to the side of the encoder case 12. A magnetic sensor such as a Hall element, or another electronic component, is mounted on the mounting substrate 22. The optical encoder section 30 is provided with a slit disc 31 that is coaxially attached to the hollow rotating shaft 11, and a mounting substrate 32 (ST substrate) that is attached to the side of the encoder case 12. A light-emitting element, a light-receiving element, a control circuit component for these elements, etc., is mounted on the mounting substrate 32.

The rotary encoder 10 is additionally provided with: a mounting substrate 41 on which is mounted, for example, an electronic component constituting, inter alia, a signal processing circuit for processing detection signals obtained from the magnetic encoder section 20 and the optical encoder section 30; and a mounting substrate 42 on which is mounted, for example, an electronic component constituting, inter alia, an interface circuit that transmits and receives signals to and from an external unit.

The rotary encoder 10 is furthermore provided with: an annular printed wiring substrate 50 on which wiring patterns for interconnecting the mounting substrates 22, 32, 41, 42 are printed; and a terminal section 70 to which are connected four inter-substrate wiring cables 60 that interconnect the printed wiring substrate 50 and each of the mounting substrates 22, 32, 41, 42, a power-supply wiring cable 71 that is drawn in from the exterior and that is for supplying electric power, and a wiring cable 72 for outputting encoder signals. Power-supply wiring patterns for distributing externally supplied electric power to the mounting substrates 22, 32, 41, 42, and signal-transfer wiring patterns that transmit and receive signals to and from the mounting substrates 22, 32, 41, 42, are mounted on the annular printed wiring substrate 50.

The annular printed wiring substrate 50 is disposed in a state of coaxially surrounding the hollow rotating shaft 11. The mounting substrates 22, 32, 41, 42 are of an arcuate form that is suited to arrangement in the annular space 15, the mounting substrates 22, 32, 41, 42 being arranged at prescribed intervals in a circumferential direction on the outer peripheral side of the printed wiring substrate 50. The four mounting substrates 22, 32, 41, 42 and the one printed wiring substrate 50 are attached to substrate supports 80 that are attached to the encoder case 12.

In the printed wiring substrate 50, cable connectors 61 are mounted at locations respectively facing each of the mounting substrates 22, 32, 41, 42 in a state in which the cable connectors 61 face radially outward. Cable connectors 62 are mounted on the mounting substrates 22, 32, 41, 42 in a state in which the cable connectors 62 face radially inward. The inter-substrate wiring cables 60 are bridged in the radial direction between the cable connectors 61 of the printed wiring substrate 50 and the cable connectors 62 of the mounting substrates 22, 32, 41, 42.

In the rotary encoder 10 according to the present example, an A-phase signal and a B-phase signal are generated respectively on the basis of detection signals from the magnetic encoder section 20 and the optical encoder section 30. The absolute rotational position of the hollow motor shaft 3 within a single rotation, the number of rotations of the hollow motor shaft 3 from an origin-point position, etc., are calculated on the basis of these encoder signals.

The rotary encoder 10 according to the present example is provided with the plurality of mounting substrates 22, 32, 41, 42 (i.e., four mounting substrates) arranged in the circumferential direction, the annular printed wiring substrate 50 that is disposed on the radially inner side of the plurality of mounting substrates 22, 32, 41, 42, and the four inter-substrate wiring cables 60 interlinking the mounting substrates 22, 32, 41, 42 and the printed wiring substrate 50, these components being provided within the annular space 15. Unlike the prior-art case shown in FIG. 3, it is unnecessary for wiring cables for connecting the mounting substrates 22, 32, 41, 42 to be routed in the circumferential direction, and the mounting substrates are electrically interconnected via the annular printed wiring substrate 50.

For example, externally supplied electric power is distributed to the mounting substrates 22, 32, 41, 42 via the printed wiring substrate 50. The need for wiring cables for supplying electric power, etc., to the mounting substrates, and the need for a space for installation of such wiring cables, are both obviated. An operation for hard-wiring a plurality of divided substrates disposed in the narrow annular space 15 is facilitated, and any deterioration in the quality of signals transferred via long wiring cables can be minimized.

It is also unnecessary to ensure space for disposing cable connectors, wiring cables, etc., between adjacent mounting substrates 22, 32, 41, 42. Due to it being unnecessary to widen gaps between the adjacent divided substrates, a narrow annular space 15 can be effectively utilized.

Furthermore, the mounting substrates 22, 32, 41, 42 are wired to the annular printed wiring substrate 50 from the radially outer side. Because the cable connectors are to be attached to and detached from the printed wiring substrate and the divided substrates from the radial direction, the cable connectors are easily attached and detached.

Figure 3:
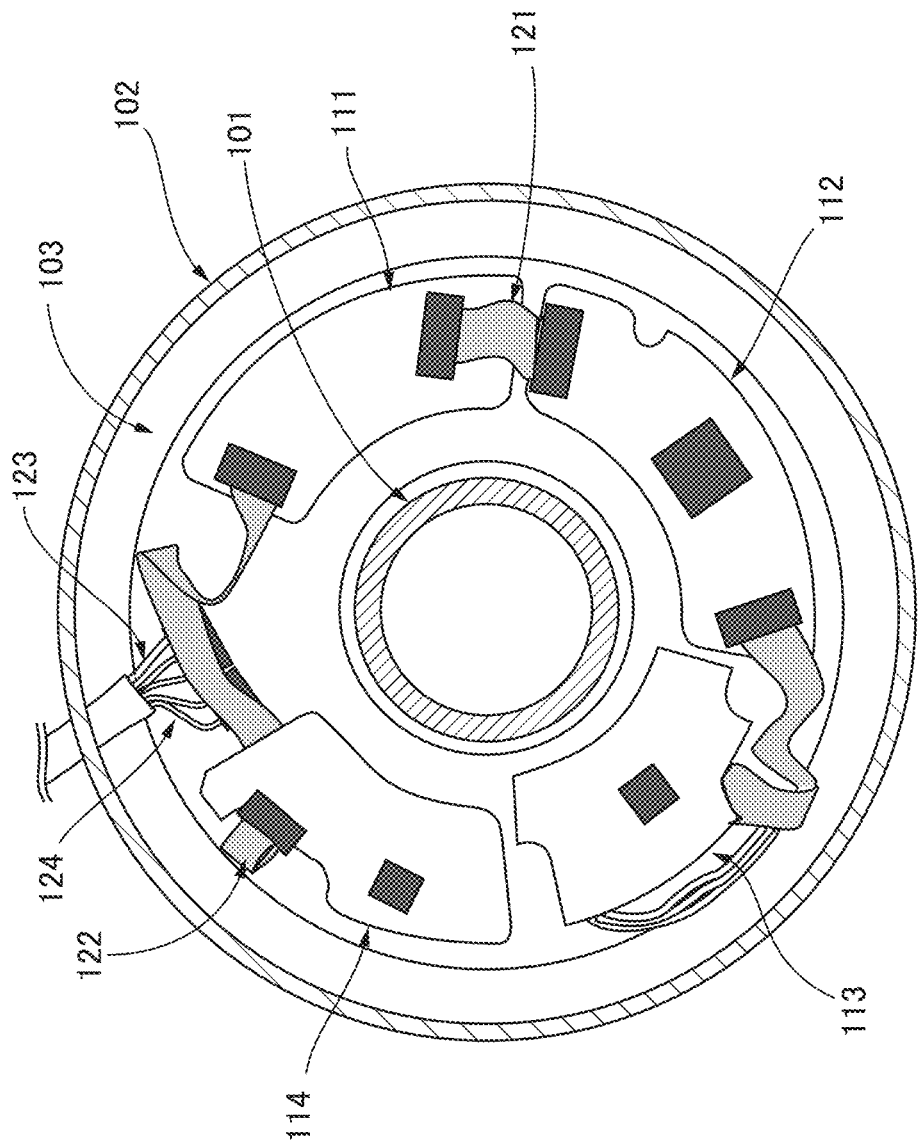
FIG. 3 is an illustrative diagram showing the arrangement state of mounting substrates of a prior-art rotary encoder.

In the case of a rotary encoder having the prior-art configuration shown in FIG. 3, it is necessary to specially design wiring cable lengths for each size of motor. Additionally, when the rotary encoder is applied to a small-sized motor, the degree of freedom in design decreases because it is necessary to design the rotary encoder in consideration of a mounting area for the cable connectors. Moreover, as a result of increases in cable length in a large-sized motor, the risk of deterioration in the quality of signals increases. However, the rotary encoder 10 according to the present example presents advantages in that the components thereof (divided substrates, printed wiring substrate, and inter-substrate wiring cables) can be standardized and in that production management is facilitated, irrespective of the size of the motor.

Figure 2:
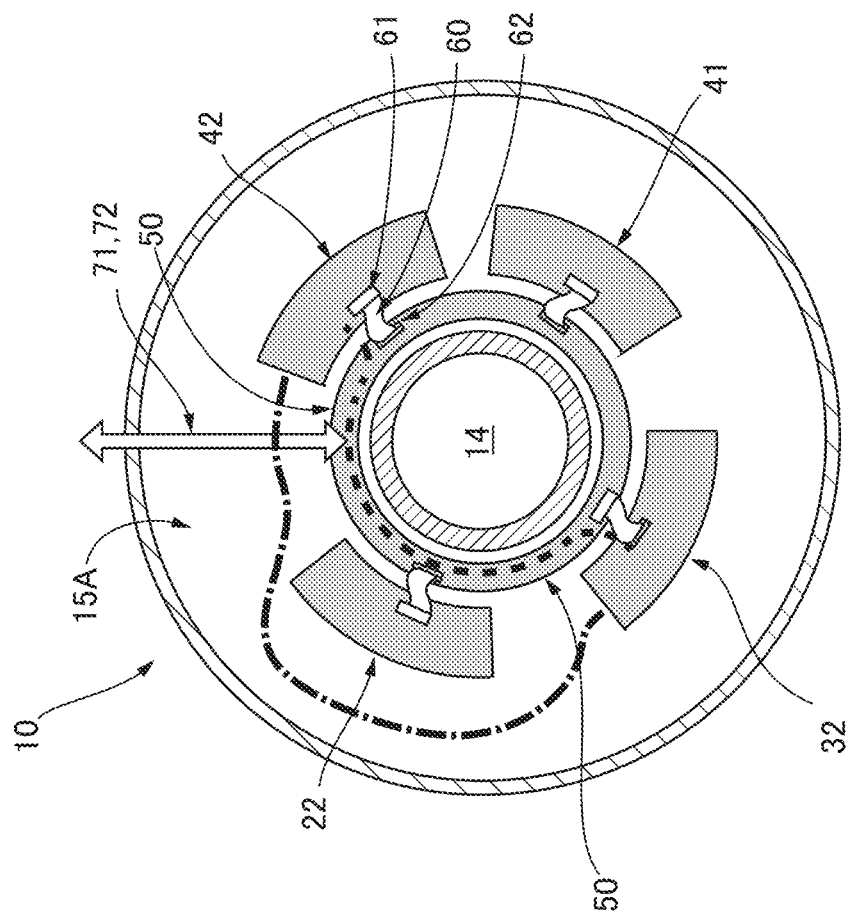
FIG. 2 is an illustrative diagram showing the effect of the rotary encoder in FIG. 1.

FIG. 2 is an illustrative diagram showing one example of a case in which the rotary encoder 10 is incorporated into a large-sized hollow motor provided with an annular space 15A having a larger diameter than in the case shown in FIG. 1. The mounting substrates 22, 32, 41, 42, the printed wiring substrate 50, and the inter-substrate wiring cables 60 can be used without modification. Even when the rotary encoder 10 is applied to a large-sized motor, it is possible to minimize the length of the wiring cables, and to satisfactorily maintain signal quality.

For example, when the mounting substrates 42, 32 are interconnected using a wiring cable, the wiring length could increase, as indicated by the dash-dotted line in FIG. 2. In the present example, because the substrates are connected via the annular printed wiring substrate 50 as indicated by the dashed line, the wiring length can be dramatically shortened.

Other Embodiments

Although a hollow motor provided with a rotary encoder to which the present invention is applied was described above, it shall be apparent that the rotary encoder according to the present invention can be applied in a similar manner to a hollow actuator provided with a hollow motor and a hollow strain wave gearing or other hollow gear drive.

Additionally, the rotary encoder 10 described above is provided with four mounting substrates as encoder substrates. The number of mounting substrates is not limited to four. Moreover, the mounting substrates are not limited to being of arcuate form.

Furthermore, in the example described above, the annular printed wiring substrate was disposed on the radially inner side relative to the mounting substrates. The printed wiring substrate can also be disposed on the radially outer side relative to the mounting substrates. Additionally, the printed wiring substrate can be disposed on the side of the mounting substrates, i.e., adjacent to the mounting substrates in the direction of the central axis of the encoder.

The invention claimed is:

1. A rotary encoder comprising:
    an encoder circuit substrate provided with a plurality of mounting substrates, the mounting substrates being configured to support electronic circuits;
    a single annular printed wiring substrate; and
    inter-substrate wiring cables that interconnect the single annular printed wiring substrate and each of the mounting substrates,
    wherein the mounting substrates are positioned adjacent to the single annular printed wiring substrate on a radially outer or inner side thereof, and are arranged along the single annular printed wiring substrate in a circumferential direction thereof with a space between adjacent ones of each of the mounting substrates;
    the inter-substrate wiring cables are bridged in a radial direction between the single annular printed wiring substrate and each of the mounting substrates; and
    the single annular printed wiring substrate is provided with:
    a power supplying wiring pattern for supplying power so that externally supplied electric power is distributed to the mounting substrates via the power supplying wiring pattern and the inter-substrate wiring cables; and
    a signal transferring wiring pattern for transferring signals so that the mounting substrates are electrically interconnected via the signal transferring wiring pattern and the inter-substrate wiring cables;
    wherein there are no wires directly interconnecting any of the mounting substrates to another of the mounting substrates.

2. The rotary encoder according to claim 1,
    wherein the mounting substrates are disposed on the radially outer side of the single annular printed wiring substrate.

3. The rotary encoder according to claim 1, further comprising:
    a hollow rotating shaft;
    an encoder case that surrounds the hollow rotating shaft; and
    an annular space formed between the hollow rotating shaft and the encoder case,
    wherein the single annular printed wiring substrate, the mounting substrates and the inter-substrate wiring cables are disposed in the annular space.

4. The rotary encoder according to claim 2, further comprising:
    a hollow rotating shaft;
    an encoder case that surrounds the hollow rotating shaft; and
    an annular space formed between the hollow rotating shaft and the encoder case,
    wherein the single annular printed wiring substrate, the mounting substrates and the inter-substrate wiring cables are disposed in the annular space.

5. A motor comprising:
    a motor output shaft; and
    the rotary encoder according to claim 1 to detect rotational information of the motor output shaft.

6. The motor according to claim 5,
    wherein the mounting substrates are disposed on the radially outer side of the single annular printed wiring substrate.

7. The motor according to claim 5, further comprising:
    a hollow rotating shaft;
    an encoder case that surrounds the hollow rotating shaft; and
    an annular space formed between the hollow rotating shaft and the encoder case,
    wherein the single annular printed wiring substrate, the mounting substrates and the inter-substrate wiring cables are disposed in the annular space.

8. The motor according to claim 6, further comprising:
    a hollow rotating shaft;
    an encoder case that surrounds the hollow rotating shaft; and
    an annular space formed between the hollow rotating shaft and the encoder case,
    wherein the single annular printed wiring substrate, the mounting substrates and the inter-substrate wiring cables are disposed in the annular space.

9. An actuator comprising:
    a motor;
    a reducer to reduce speed of output rotation of the motor; and
    the rotary encoder according to claim 1 to detect rotational information of an output shaft of the reducer.

10. The actuator according to claim 9,
    wherein the mounting substrates are disposed on the radially outer side of the single annular printed wiring substrate.

11. The actuator according to claim 9, further comprising:
    a hollow rotating shaft;
    an encoder case that surrounds the hollow rotating shaft; and
    an annular space formed between the hollow rotating shaft and the encoder case,
    wherein the single annular printed wiring substrate, the mounting substrates and the inter-substrate wiring cables are disposed in the annular space.

12. The actuator according to claim 10, further comprising:
    a hollow rotating shaft;
    an encoder case that surrounds the hollow rotating shaft; and
    an annular space formed between the hollow rotating shaft and the encoder case,
    wherein the single annular printed wiring substrate, the mounting substrates and the inter-substrate wiring cables are disposed in the annular space.

13. The rotary encoder according to claim 1, wherein the power supplying wiring pattern of the single annular printed wiring substrate is directly connected to each of the mounting substrates via the inter-substrate wiring cables.

14. The rotary encoder according to claim 13, wherein the signal transferring wiring pattern of the single annular printed wiring substrate is directly connected to each of the mounting substrates via the inter-substrate wiring cables.

15. The rotary encoder according to claim 1, wherein the signal transferring wiring pattern of the single annular printed wiring substrate is directly connected to each of the mounting substrates via the inter-substrate wiring cables.

16. A rotary encoder comprising:
- an encoder circuit substrate provided with a plurality of mounting substrates, the mounting substrates being configured to support electronic circuits;
- a single annular printed wiring substrate;
- inter-substrate wiring cables that interconnect the single annular printed wiring substrate and each of the mounting substrates; and
- first cable connectors mounted on the single annular printed wiring substrate, and second cable connectors mounted on the respective mounting substrates,
- wherein the mounting substrates are of an arcuate form, respectively, and are positioned adjacent to the single annular printed wiring substrate on a radially outer side thereof, and are arranged along the single annular printed wiring substrate in a circumferential direction thereof with a space between adjacent ones of each of the mounting substrates;
- the first cable connectors are mounted on the single annular printed wiring substrate at locations respectively facing each of the mounting substrates in a state in which the first cable connectors face radially outward;
- the second cable connectors are mounted on the mounting substrates, respectively, in a state in which the second cable connectors face radially inward,
- the inter-substrate wiring cables are bridged in a radial direction between the first cable connectors and the second cable connectors; and
- the single annular printed wiring substrate is provided with:
- a power supplying wiring pattern for supplying power so that externally supplied electric power is distributed to the mounting substrates via the power supplying wiring pattern and the inter-substrate wiring cables; and
- a signal transferring wiring pattern for transferring signals so that the mounting substrates are electrically interconnected via the signal transferring wiring pattern and the inter-substrate wiring cables;
- wherein there are no wires directly interconnecting any of the mounting substrates to another of the mounting substrates.

\* \* \* \* \*